United States Patent
Xiao et al.

(10) Patent No.: US 11,972,989 B2
(45) Date of Patent: Apr. 30, 2024

(54) DISPLAY SUBSTRATE AND METHOD FOR DETECTING BROKEN FANOUT WIRE OF DISPLAY SUBSTRATE

(71) Applicant: BOE TECHNOLOGY GROUP CO., LTD., Beijing (CN)

(72) Inventors: Li Xiao, Beijing (CN); Dongni Liu, Beijing (CN); Minghua Xuan, Beijing (CN); Jiao Zhao, Beijing (CN); Haoliang Zheng, Beijing (CN); Zhenyu Zhang, Beijing (CN); Liang Chen, Beijing (CN); Hao Chen, Beijing (CN); Jing Liu, Beijing (CN); Qi Qi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 706 days.

(21) Appl. No.: 17/253,960

(22) PCT Filed: Nov. 29, 2019

(86) PCT No.: PCT/CN2019/122080
§ 371 (c)(1),
(2) Date: Dec. 18, 2020

(87) PCT Pub. No.: WO2021/102945
PCT Pub. Date: Jun. 3, 2021

(65) Prior Publication Data
US 2021/0375702 A1 Dec. 2, 2021

(51) Int. Cl.
*H01L 21/66* (2006.01)
*G01R 31/54* (2020.01)
(Continued)

(52) U.S. Cl.
CPC .............. *H01L 22/32* (2013.01); *G01R 31/54* (2020.01); *G01R 31/58* (2020.01); *H01L 22/22* (2013.01);
(Continued)

(58) Field of Classification Search
CPC ......... H01L 22/32; H01L 22/22; H01L 24/02; H01L 27/124; H01L 25/167;
(Continued)

(56) References Cited

U.S. PATENT DOCUMENTS

2014/0354285 A1* 12/2014 Kim ................... G09G 3/006
324/414
2019/0348357 A1* 11/2019 Lee .................... H05K 1/147

FOREIGN PATENT DOCUMENTS

| CN | 201043991 Y | 4/2008 |
| CN | 104808859 A | 7/2015 |

(Continued)

*Primary Examiner* — Herve-Louis Y Assouman
(74) *Attorney, Agent, or Firm* — Nath, Goldberg & Meyer; Joshua B. Goldberg

(57) ABSTRACT

The present application provides a method for detecting a broken fanout wire of a display substrate, and a display substrate, and belongs to the field of display technology. In the method for detecting a broken fanout wire, the display substrate includes a base substrate having first and second surfaces opposite to each other, and a plurality of connection structures disposed at intervals on the first surface; and each connection structure includes first and second pads and a fanout wire electrically connecting the first pad to the second pad. The method for detecting a broken fanout wire includes: forming at least one detection unit, which includes: connecting at least two connection structures in series through a connecting part; and measuring a head and an end
(Continued)

of the detection unit to obtain resistance of the detection unit, and determining whether there is a broken fanout wire in the detection unit.

9 Claims, 6 Drawing Sheets

(51) Int. Cl.
- *G01R 31/58* (2020.01)
- *H01L 23/00* (2006.01)
- *H01L 25/16* (2023.01)
- *H01L 27/12* (2006.01)
- *H10K 59/131* (2023.01)

(52) U.S. Cl.
CPC ............ *H01L 24/02* (2013.01); *H01L 27/124* (2013.01); *H10K 59/131* (2023.02); *H01L 25/167* (2013.01); *H01L 2224/02321* (2013.01); *H01L 2224/02375* (2013.01); *H01L 2224/02379* (2013.01)

(58) Field of Classification Search
CPC . H01L 2224/02321; H01L 2224/02375; H01L 2224/02379; G01R 31/54; G01R 31/58; G01R 31/2853; H10K 59/131; G09G 3/3233; G09G 3/006

See application file for complete search history.

(56) References Cited

FOREIGN PATENT DOCUMENTS

| | | |
|---|---|---|
| CN | 104965321 A | 10/2015 |
| CN | 205750184 U | 11/2016 |
| CN | 108845702 A | 11/2018 |
| CN | 110082631 A | 8/2019 |

\* cited by examiner

DISPLAY SUBSTRATE AND METHOD FOR DETECTING BROKEN FANOUT WIRE OF DISPLAY SUBSTRATE

CROSS-REFERENCE TO RELATED APPLICATIONS

This is a National Phase Application filed under 35 U.S.C. 371 as a national stage of PCT/CN2019/122080, filed on Nov. 29, 2019, the content of each of which is hereby incorporated by reference in its entirety.

TECHNICAL FIELD

The present application belongs to the field of display technology, and particularly relates to a method for detecting a broken fanout wire of a display substrate, and a display substrate.

BACKGROUND

Nowadays most display panels have borders, and wiring pads (e.g., integrated circuit bonding pads) are usually disposed on the periphery of a display region of a display panel. Full-screen borderless display products can bring better viewing experience to users, and therefore, will certainly lead a new consumption trend. Full-screen technology has gradually become the mainstream technology of handheld devices such as mobile phones. At present, the Gate Driver On Array (GOA) technology is adopted to narrow left and right borders, and the Chip On Film (COF) technology is adopted to narrow lower borders.

SUMMARY

In a first aspect, the embodiments of the present application provide a method for detecting a broken fanout wire of a display substrate. The display substrate includes: a base substrate having a first surface and a second surface that are opposite to each other, and a plurality of connection structures disposed at intervals on the first surface; and each connection structure includes a first pad, a second pad and a fanout wire that electrically connects the first pad to the second pad. The method for detecting a broken fanout wire includes:
forming at least one detection unit, which includes: connecting at least two connection structures in series through a connecting part; and
measuring a head and an end of the detection unit to obtain resistance of the detection unit, and determining whether there is a broken fanout wire in the detection unit.

The step of forming at least one detection unit includes:
connecting the first pads of every two adjacent connection structures through a connecting part; except for the two connection structures which are farthest away from each other, connecting the second pads of every two adjacent connection structures through a connecting part, and taking every N connection structures connected in series as one detection unit, N being an integer greater than or equal to 2.

N is an even number.

The step of forming at least one detection unit includes:
except for the two connection structures which are farthest away from each other, connecting the first pads of every two adjacent connection structures through a connecting part; and connecting the second pads of every two adjacent connection structures through a connecting part, and taking every N connection structures connected in series as one detection unit, N being an integer greater than or equal to 2.

Each detection unit includes a plurality of detection sub-units; each detection sub-unit includes M connection structures connected in series, M being an integer greater than or equal to 1. The step of measuring the head and the end of the detection unit to obtain the resistance of the detection unit, and determining whether there is a broken fanout wire in the detection unit includes:
measuring the head and the end of each detection unit to obtain the resistance of the detection unit, and determining whether there is a broken fanout wire in the detection unit according to a first preset condition and the obtained resistance of the detection unit; and
in a case there is a broken fanout wire in the detection unit, measuring the head and the end of each detection sub-unit of the detection unit having a broken fanout wire to find the broken fanout wire.

Both the head and the end of the detection sub-unit are the second pads.

After the step of measuring the head and the end of the detection unit to obtain the resistance of the detection unit, and determining whether there is a broken fanout wire in the detection unit, the method further includes:
cutting away the connecting part, which is located on a side of the second pad away from the first pad, from the display substrate; and cutting off the connecting part located on a side of the first pad away from the second pad.

In a second aspect, the embodiments of the present application provide a display substrate, including:
a base substrate having a first surface and a second surface that are opposite to each other; and
at least one detection unit, which is disposed on the base substrate, and includes: at least two connection structures that are connected in series through a connecting part, each connection structure including a first pad, a second pad, and a fanout wire that electrically connects the first pad to the second pad.

The first pads of every two adjacent connection structures are connected through a connecting part; except for the two connection structures which are farthest away from each other, the second pads of every two adjacent connection structures are connected through a connecting part, and every N connection structures connected in series are taken as one detection unit, N being an integer greater than or equal to 2.

Except for the two connection structures which are farthest away from each other, the first pads of every two adjacent connection structures are connected through a connecting part; the second pads of every two adjacent connection structures are connected through a connecting part; and every N connection structures connected in series are taken as one detection unit, N being an integer greater than or equal to 2.

A plurality of third pads and pixel units are disposed at intervals on the second surface;
the second pads are connected to the third pads through side wires; and
the third pads are connected to the pixel units through signal lead-in lines.

In a third aspect, the embodiments of the present application provide a display substrate, including:
a base substrate having a first surface and a second surface that are opposite to each other; and a plurality of connection structures and a plurality of connecting parts, which are disposed on the base substrate, each connection structure including a first pad, a second pad, and a fanout wire that electrically connects the first pad to the second pad; and each connecting part corresponds to the first pads of two connection structures; different connecting parts correspond to different first pads, the connecting parts are separated from the first pads.

A plurality of third pads and pixel units are disposed at intervals on the second surface;

the second pads are connected to the third pads through side wires; and the third pads are connected to the pixel units through signal lead-in lines.

DETAILED DESCRIPTION

Figure 1:
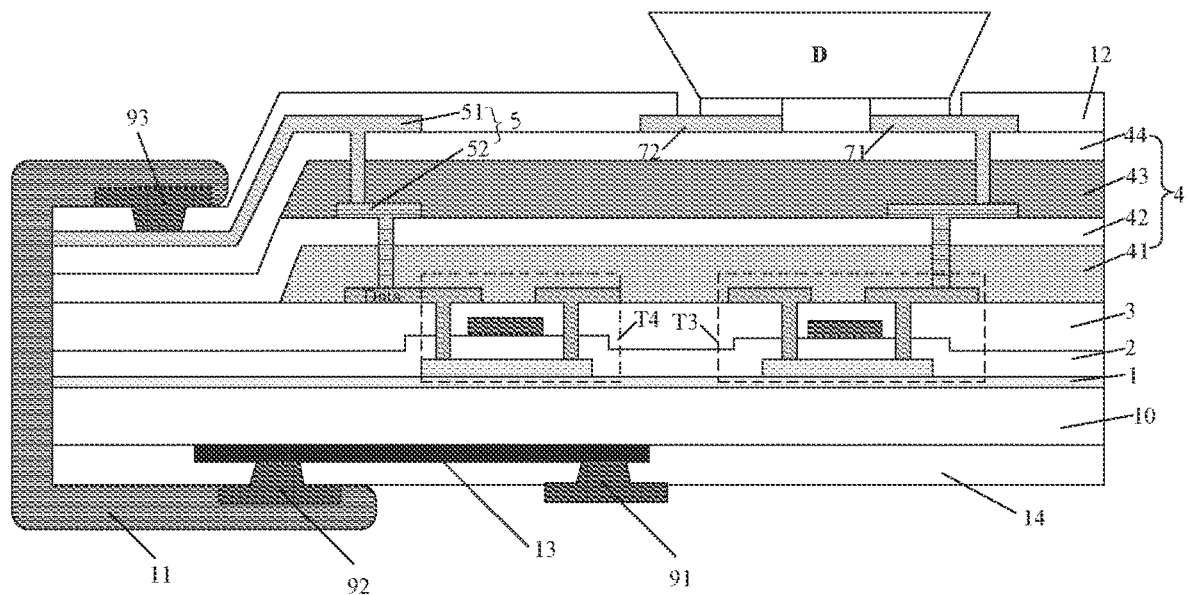
FIG. 1 is a cross-sectional view of a display substrate according to the embodiments of the present application.

In order to enable those skilled in the art to better understand the technical solutions of the present application, the present application is further described in detail below with reference to the accompanying drawings and specific embodiments.

Unless otherwise defined, technical terms or scientific terms used in the present disclosure should have general meanings that can be understood by people with ordinary skills in the technical field of the present disclosure. The words "first", "second" and the like used in the present disclosure do not denote any order, quantity, or importance, but are just used to distinguish between different elements. Similarly, the words "one", "a" and the like are not used to limit the quantity, but denote "at least one". The words "include", "comprise" and the like indicate that an element or object before the words covers the elements or objects or the equivalents thereof listed after the words, rather than excluding other elements or objects. The words "connect", "couple" and the like are not restricted to physical or mechanical connection, but may also indicate electrical connection, whether direct or indirect. The words "on", "under", "left", "right" and the like are only used to indicate relative positional relationships. When an absolute position of an object described is changed, the relative positional relationships may also be changed accordingly.

In order to realize real borderless display, the applicant proposes implementing the borderless display technology by front and back processes of a display substrate. Specifically, a front side of a base substrate is a side provided with thin film transistors and other driving elements, a back side of the base substrate is a side provided with integrated circuit bonding pads (IC bonding pads), and connection between the signals of the front side and those of the back side is achieved by forming holes in the base substrate and filling the holes with metal, or by performing a side routing process, so as to realize borderless display. In the case where the connection between the signals of the front side and those of the back side of the display substrate is achieved by performing the side routing process, a fanout area of the display substrate is arranged on the back side of the base substrate. In such case, a first pad and a second pad are disposed on the back side of the base substrate, the first pad is configured to be bonded to an integrated circuit and is electrically connected with the second pad through a fanout wire disposed in the fanout area, and the second pad is connected with a third pad, which is disposed on the front side of the base substrate, through a side wire so as to transmit an external signal provided by the integrated circuit to the driving element(s) on the front side of the base substrate.

In some embodiments of the present application, a base substrate of a display substrate has a first surface and a second surface that are opposite to each other, one of the first and second surfaces is configured to arrange pixel units, and the other is configured to arrange the first pads bonded to the integrated circuits; for the convenience of description, the surface of Preliminary Amendment the base substrate provided with the first pads bonded to the integrated circuits is referred to as the first surface, and the surface of the base substrate provided with the pixel units is referred to as the second surface. That is, in the embodiments of the present application, the first and second pads are provided on the first surface of the base substrate; the pixel units and the third pads are provided on the second surface of the base substrate; the third pads are connected with the pixel units through signal lead-in lines and are also connected with the second pads through side wires, and the second pads are connected with the first pads through fanout wires. In this way, the signals provided by the integrated circuits bonded to the first pads may be transmitted to the pixel units through the fanout wires, the side wires and the signal lead-in lines. The structure formed by a first pad, a second pad and a fanout wire that electrically connects the first pad with the second pad is defined as a connection structure; that is, a plurality of connection structures are disposed at intervals on the first surface of the display substrate.

Figure 2:
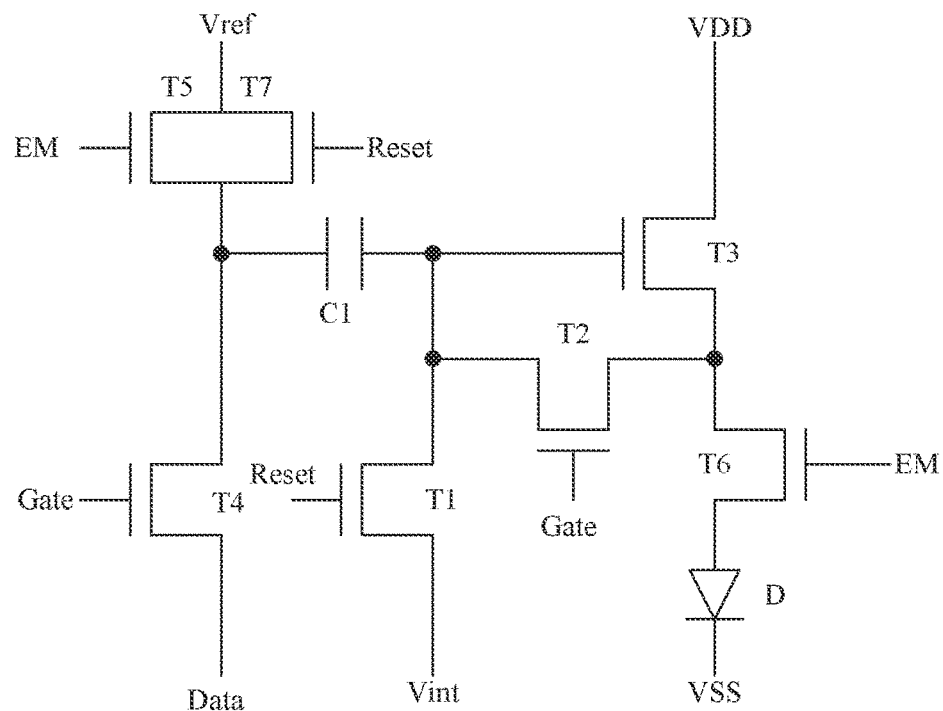
FIG. 2 is a schematic diagram of a pixel circuit in a display substrate according to the embodiments of the present application.
Figure 3:
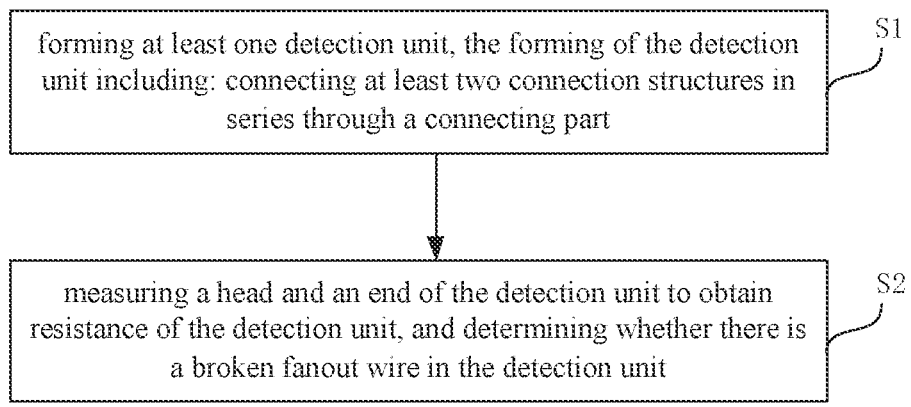
FIG. 3 is a flowchart illustrating a method for detecting a broken fanout wire of a display substrate according to the embodiments of the present application.

The electrically connected fanout wires, side wires and signal lead-in lines may provide the pixel units with data voltage signals, power voltage signals, etc. In order to clarify the specific structure of the display substrate in the embodiments of the present application, FIG. 1 shows an example of the structure of the display substrate to facilitate better understanding of the display substrate in the embodiments of the present application. However, it should be understood that the display substrate shown in FIG. 1 should not be construed as a limitation to the scope of the embodiments of the present application. A pixel circuit in the pixel unit at least includes a switching transistor and a driving transistor, and it may further include a threshold compensation transistor, a storage capacitor, and the like. FIG. 2 shows an example of the pixel circuit, which specifically includes: a first reset transistor T1, a threshold compensation transistor T2, a driving transistor T3, a switching transistor T4, a first emission control transistor T5, a second emission control transistor T6, a second reset transistor T7, a first storage capacitor C1, and a light emitting device D. A first electrode of the first reset transistor T1 is connected to an initial voltage signal terminal Vint, a second electrode of the first reset transistor T1 is connected to a second terminal of the first storage capacitor C1, a first electrode of the threshold compensation transistor T2 and a control electrode of the driving transistor T3, and a control electrode of the first reset transistor T1 is connected to a reset signal terminal Reset; second electrode of the threshold compensation transistor T2 is connected to a second electrode of the driving transistor T3 and a first electrode of the second emission control transistor T6, and a control electrode of the threshold compensation transistor T2 is connected to a gate line Gate; a first electrode of the driving transistor T3 is connected to a first power voltage terminal VDD; a first electrode of the switching transistor T4 is connected to a data line Data, a second electrode of the switching transistor T4 is connected to a second electrode of the first emission control transistor T5, a second electrode of the second reset transistor T7, and a first electrode of the first storage capacitor C1, and a control electrode of the switching transistor T4 is connected to the gate line; a first electrode of the first emission control transistor T5 is connected to a reference voltage signal terminal Vref, and a control electrode of the first emission control transistor T5 is connected to an emission control line EM; a second electrode of the second emission control transistor T6 is connected to a first electrode of the light emitting device D, and a control electrode of the second emission control transistor T6 is connected to the emission control line EM; and a first electrode of the second reset transistor T7 is connected to the reference voltage signal terminal Vref, a control electrode of the second reset transistor T7 is connected to the reset signal terminal Reset, and a second electrode of the light emitting device is connected to a second power voltage terminal VSS.

The above transistors may be thin film transistors, field effect transistors, or other devices having the same characteristics. Since the source and the drain of the transistor are symmetrical, there is no difference between the source and the drain. In the embodiments of the present application, in order to distinguish between the source and the drain of a transistor, one of the source and the drain is referred to as a first electrode, the other one is referred to as a second electrode, and the gate is referred to as a control electrode. In addition, the transistors can be divided into N-type transistors and P-type transistors according to the characteristics of the transistors. In the case where a P-type transistor is used, the first electrode is the source of the P-type transistor, the second electrode is the drain of the P-type transistor, and the source and the drain are electrically connected when a low level is input into the gate; and in the case where an N-type transistor is used, the first electrode is the source of the N-type transistor, the second electrode refers to the drain of the N-type transistor, and the source and the drain are electrically connected when a high level is input into the gate. As an example, the above-described transistors in the pixel circuit are all N-type transistors. But it is readily envisaged by those skilled in the art without creative efforts that the P-type transistors may be used in the above pixel circuit, and therefore, the use of the P-type transistors also falls within the scope of the embodiments of the present application.

The connected fanout wires, the side wires, and the signal lead-in lines may provide data voltage signals for the pixel units. The signal lead-in lines shown in FIG. 1 include a first signal lead-in sub-line and a second signal lead-in sub-line. The positional relationship of the layers shown in the cross-sectional view of the display substrate in FIG. 1 will be described, but only some elements are shown in FIG. 1, for example, the switching transistor T4 and the driving transistor T3. As an example, the switching transistor T4 and the driving transistor T3 are top-gate thin film transistors in the description below.

The display substrate includes: a base substrate 10; a buffer layer 1 on a second surface of the base substrate 10; an active layer of the switching transistor T4 and an active layer of the driving transistor T3, which are on the buffer layer 1 and located in the same layer; a gate insulating layer 2, which is located on the active layers of the switching transistor T4 and the driving transistor T3, and covers a display region and a bonding area; a gate of the switching transistor T4 and a gate of the driving transistor T3, which are on the gate insulating layer 2 and located in the same layer; a first insulating layer 3, which is located on the gates of the switching transistor T1 and the driving transistor T3, and covers the display region and the bonding area; a source and a drain of the switching transistor T4, a source and a drain of the driving transistor T3, and a data line connected to the source of the switching transistor T4, which are on the first insulating layer 3 and located in the same layer; a first planarization layer 41, which is located on the sources and the drains of the switching transistor T4 and the driving transistor T3 and the data line connected to the source of the switching transistor T4, and is arranged only in the display region; a first passivation layer 42, which is located on the first planarization layer 41, and covers the display region and the bonding area; a second signal lead-in sub-line 52 and a first connection electrode 6, which are above the first planarization layer 41 and located in the same layer, the second signal lead-in sub-line 52 being connected to the data line through a first via penetrating the first planarization layer 41 and the first passivation layer 42, and the first connection electrode 6 being connected to the drain of the driving transistor T3 through a third via penetrating the first planarization layer 41 and the first passivation layer 42; a second planarization layer 43, which is located on the layer where the second signal lead-in sub-line 52 and the first connection electrode 6 is located, and is arranged only in the display region; a second passivation layer 44, which is located on the second planarization layer 43, and covers the display region and the bonding area; a first signal lead-in sub-line 51, a first spacer 71 and a second spacer 72, which are on the second passivation layer 44 and located in the same layer, the first signal lead-in sub-line 51 extending from the display region to the bonding area and being connected with the second signal lead-in sub-line 52 through a second via penetrating the second planarization layer 43 and the second passivation layer 44, and the first spacer 71 being connected to the first connection electrode 6 through a fourth via penetrating the second planarization layer 43 and the second passivation layer 44; and a third passivation layer 12 on the first signal lead-in sub-line 51, the first spacer 71 and the second spacer 72. A first electrode of the light emitting device D is electrically connected to the first spacer 71 through a fifth via penetrating the third passivation layer, and a second electrode of the light emitting device D is electrically connected to the second spacer 72 through another fifth via penetrating the third passivation layer. The second surface 10-2 of the base substrate is provided thereon with a fanout wire 13, a fourth passivation layer 14 on the fanout wire 13, and a first pad 91 and a second pad 92 which are located on the fourth passivation layer 14. The second pad 92 is connected to one end of the fanout wire 13 through a sixth via penetrating the fourth passivation layer 14, and the first pad 91 is connected to the other end of the fanout wire 13 through a seventh via penetrating the fourth passivation layer 14; and the first signal lead-in sub-line 51 is connected to a third pad 93 in the bonding area, and the third pad 93 is connected to the second pad 92 on the second surface 10-2 of the base substrate through a side wire 11.

The light emitting device D may be a micro inorganic light emitting diode, and furthermore, may be a current-type light emitting diode, such as a micro light emitting diode (Micro LED) or a mini light emitting diode (Mini LED). The light emitting device D in the embodiments of the present application may also be an organic light emitting diode (OLED). One of the first and second electrodes of the light emitting device D is an anode, and the other is a cathode.

As described above, the first pad 91, the second pad 92 and the fanout wire 13 are disposed on the first surface of the base substrate of the display substrate. Although the problem of short circuit is unlikely to happen to the first surface of the base substrate due to larger wiring space of the first surface and larger intervals between the wires, the light emitting device needs to be bonded to the first spacer and the second spacer of the second surface of the base substrate after the processing of the first surface and the second surface of the base substrate is completed, and thus the problems of machine friction, transportation friction and the like may happen during the bonding process, which may further cause superficial scratches of the first surface of the base substrate, and/or cause the problem of open circuit due to scratches of the fanout wire 13, the first pad 91 and the second pad 92 on the first surface of the base substrate. If the fanout wire 13 is broken, the subsequent module bonding and panel testing will be significantly affected. Therefore, the test of detecting whether the fanout wire 13 on the first surface of the display substrate is broken or not is important. Thus, the embodiments of the present application provide the following technical solutions.

As shown in FIG. 3, FIGS. 4A-4C and FIG. 5, the embodiments of the present application provide a method for detecting broken fanout wire 13 of the display substrate, which includes the following steps:

S1, forming at least one detection unit C. The step of forming the detection unit C includes connecting at least two connection structures in series through a connecting part 15.

Figure 4A:
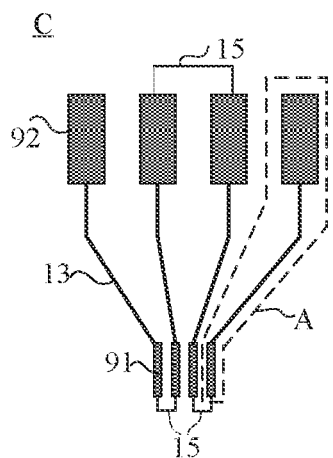
FIG. 4A is a schematic diagram of a detection unit of a display substrate according to the embodiments of the present application.

FIG. 4A shows an example that each detection unit C includes four connection structures according to some embodiments of the present application, and the first connection structure, the second connection structure, the third connection structure and the fourth connection structure are separately arranged from left to right along a horizontal direction. The step S1 may specifically include: connecting a second pad 92 of the second connection structure with a second pad 92 of the third connection structure through a connecting part 15; connecting a first pad 91 of the first connection structure with a first pad 91 of the second connection structure through a connecting part 15; and connecting a first pad 91 of the third connection structure with a first pad 91 of the fourth connection structure through a connecting part 15, so as to form the detection unit C including four connection structures that are connected in series. In such case, a second pad 92 of the first connection structure and a second pad 92 of the fourth connection structure are used as a head and an end of the detection unit C, i.e., the detection points of the detection unit C.

Figure 4B:
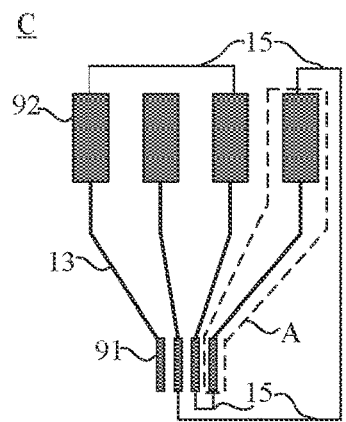
FIG. 4B is a schematic diagram of another detection unit of a display substrate according to the embodiments of the present application.

FIG. 4B shows another example of a detection unit C including four connection structures. Similarly, the first connection structure, the second connection structure, the third connection structure and the fourth connection structure are separately arranged from left to right along the horizontal direction. The step S1 may specifically include: connecting a second pad 92 of the first connection structure with a second pad 92 of the third connection structure through a connecting part 15; connecting a first pad 91 of the second connection structure with a second pad 92 of the fourth connection structure through a connecting part 15; and connecting a first pad 91 of the third connection structure with a first pad 91 of the fourth connection structure through a connecting part 15, so as to form the detection unit C including four connection structures that are connected in series. In such case, a first pad 91 of the first connection structure and a second pad 92 of the second connection structure are used as a head and an end of the detection unit C, i.e., the detection points of the detection unit C.

Figure 4C:
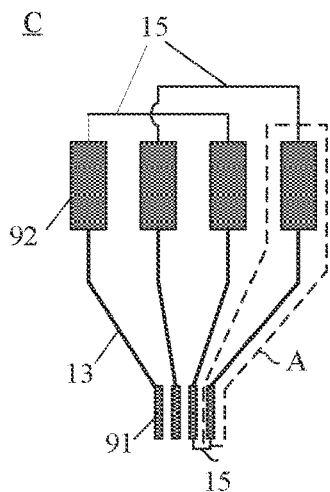
FIG. 4C is a schematic diagram of another detection unit of a display substrate according to the embodiments of the present application.

FIG. 4C shows another example of a detection unit C including four connection structure according to some other embodiments of the present application. A second pad 92 of the first connection structure is connected with a second pad 92 of the third connection structure through a connecting part 15; a second pad 92 of the second connection structure is connected with a second pad 92 of the fourth connection structure through a connecting part 15; and a first pad 91 of the third connection structure is connected with a first pad 91 of the fourth connection structure through a connecting part 15. In such case, a first pad 91 of the first Preliminary Amendment connection structure and a first pad 91 of the second connection structure are used as a head and an end of the detection unit C, that is, the first pad 91 of the first connection structure and the first pad 91 of the second connection structure serve as the detection points of the detection unit C. It should be noted that the two connecting parts 15 used to connect the second pads 92, which cross over each other, need to be arranged in different layers, so as to avoid a short-circuit. In order to reduce the complexity of the subsequent processes and the manufacturing process of the substrate, those skilled in the art may choose to design the serial relationship of the connection structures in such a way that there is no crossover of the connecting parts in practical application.

Figure 5:
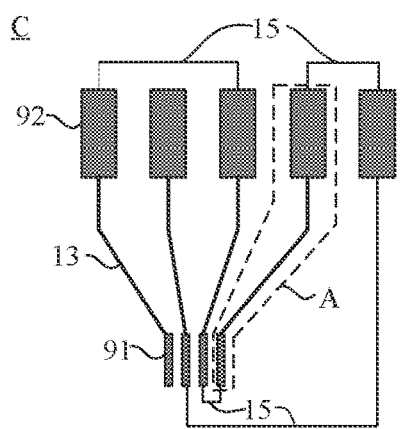
FIG. 5 is a schematic diagram of another detection unit of a display substrate according to the embodiments of the present application.

FIG. 5 shows a detection unit C including five connection structures. Similarly, the first connection structure, the second connection structure, the third connection structure, the fourth connection structure and the fifth connection structure are separately arranged from left to right along the horizontal direction. The step S1 may specifically include: connecting a second pad 92 of the first connection structure with a second pad 92 of the third connection structure through a connecting part 15; connecting a first pad 91 of the second connection structure with a second pad 92 of the fifth connection structure through a connecting part 15; connecting a first pad 91 of the third connection structure with a first pad 91 of the fourth connection structure through a connecting part 15; and connecting a second pad 92 of the fourth connection structure with a second pad 92 of the fifth connection structure through a connecting part 15, so as to form the detection unit C including five connection structures that are connected in series. In such case, a first pad 91 of the first connection structure and a second pad 92 of the second connection structure are used as a head and an end of the detection unit C, i.e., the detection points of the detection unit C.

The head and the end of the detection unit C formed in the step S1 are the second pads 92 in some embodiments. Both the width of a pin of the integrated circuit and the intervals between the pins are small, so the first pads 91 to be bonded to the integrated circuit are arranged at the same small intervals as the pins, which is inconvenient for the detection; while the second pads 92 are connected to the pads on the other surface of the display panel through the side wires, and can be made wider and larger because the intervals between the pads on the other surface of the display panel are relatively large. Therefore, it is convenient for the subsequent detection to use the second pads 92 as the head and the end of the detection unit C.

S2, measuring a head and an end of the detection unit C to obtain resistance of the detection unit C, and determining whether there is a broken fanout wire 13 in the detection unit C.

In the step S2, the head and the end of the detection unit C formed in the step S1 may be measured to obtain the resistance values of the first pad 91, the second pad 92, and the fanout wire 13 of each connection structure in each detection unit C, and then it may be determined according to the obtained resistance values whether there is a broken fanout wire 13 in the detection unit C. For example, it is determined that there is a broken fanout wire 13 in the detection unit C if the obtained resistance value of the detection unit C is far greater than a preset value or reaches a MC level; and it is determined that there is no broken fanout wire 13 in the detection unit C if the obtained resistance value of the detection unit C approximates to or is equal to the preset value.

The embodiments of the present application provide a method for detecting a broken fanout wire 13, which determines whether there is a broken fanout wire 13 by measuring the resistance of the detection unit C. In this way, when a broken fanout wire 13 is detected with the method, it may be repaired to improve the yield of display substrates. Moreover, by using the second pads 92 as the detection points in the method provided by the embodiments of the present application, the measurement of the resistance is facilitated.

In some embodiments, the step S1 may specifically include the following steps:
connecting the first pads 91 of every two adjacent connection structures through a connecting part 15; except for the two connection structures which are farthest away from each other, connecting the second pads 92 of every two adjacent connection structures through a connecting part 15, and taking every N serially connected connection structures as one detection unit C, N being an integer greater than or equal to 2.

Figure 6:
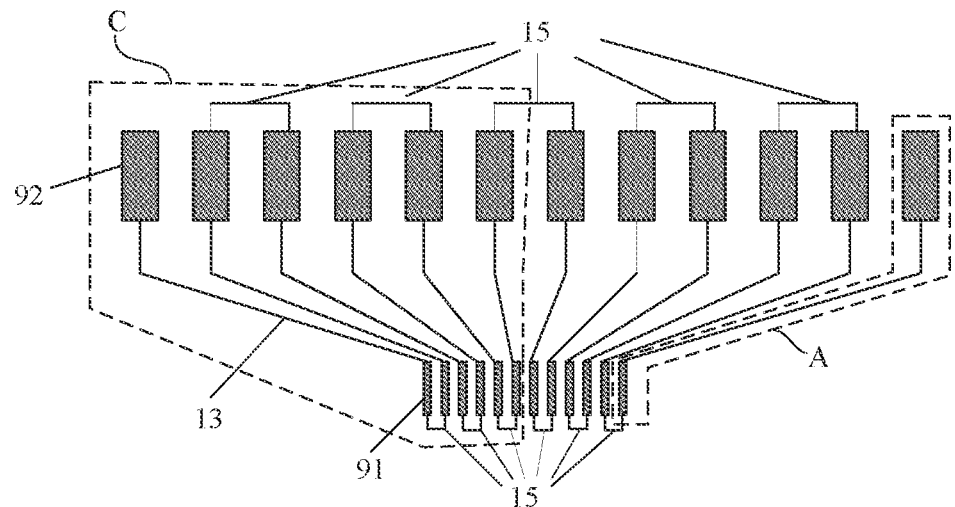
FIG. 6 is a schematic diagram of another detection unit of a display substrate according to the embodiments of the present application.

That is, the first pads 91 and the second pads 92 may be connected through the connecting parts to form an S-type structure as shown in FIG. 6, with the second pads 92 of the first connection structure and the last connection structure serving as a head and an end of the S-type structure, respectively. Then, every N connection structures connected in series are taken as one detection unit C. The connection structures are divided into several detection units C, so that it is convenient to position an area where a broken fanout wire 13 is located in subsequent detection process.

In some embodiments, N is even so that it is ensured that both the head and the end of each detection unit C are the second pads 92, which may facilitate the subsequent detection process. In some other embodiments, N may be odd.

In some embodiments, the step S1 may specifically include the following steps:
except for the two connection structures which are farthest away from each other, connecting the first pads 91 of every two adjacent connection structures through a connecting part 15; and connecting the second pads 92 of every two adjacent connection structures through a connecting part 15, and taking every N serially connected connection structures as one detection unit C, N being an integer greater than or equal to 2.

Figure 7:
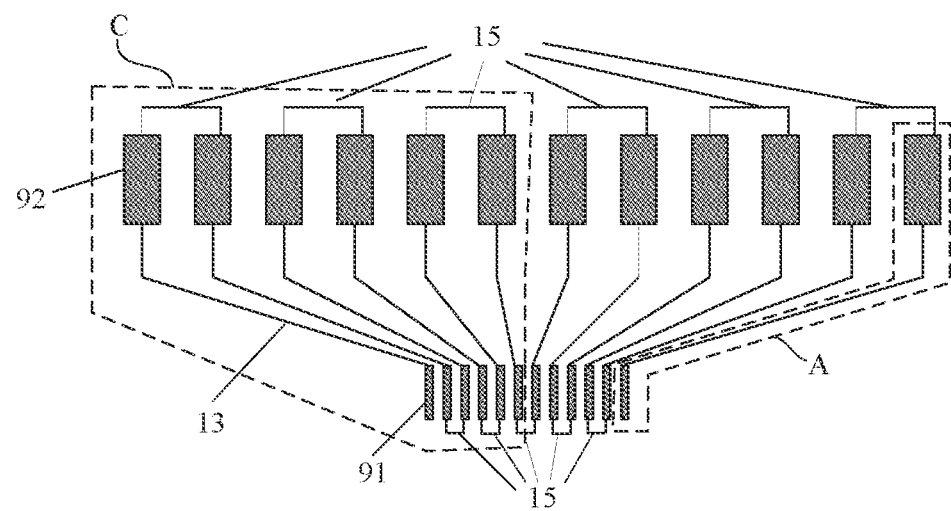
FIG. 7 is a schematic diagram of another detection unit of a display substrate according to the embodiments of the present application.

In this way, the first pads 91 and the second pads 92 may be connected through the connecting parts to form an S-type structure as shown in FIG. 7, with the first pads 91 of the first connection structure and the last connection structure serving as a head and an end of the S-type structure, respectively. Then, every N connection structures connected in series are taken as one detection unit C. The connection structures are divided into several detection units C, so that it is convenient to position an area where a broken fanout wire 13 is located in the subsequent detection process.

Figure 8:
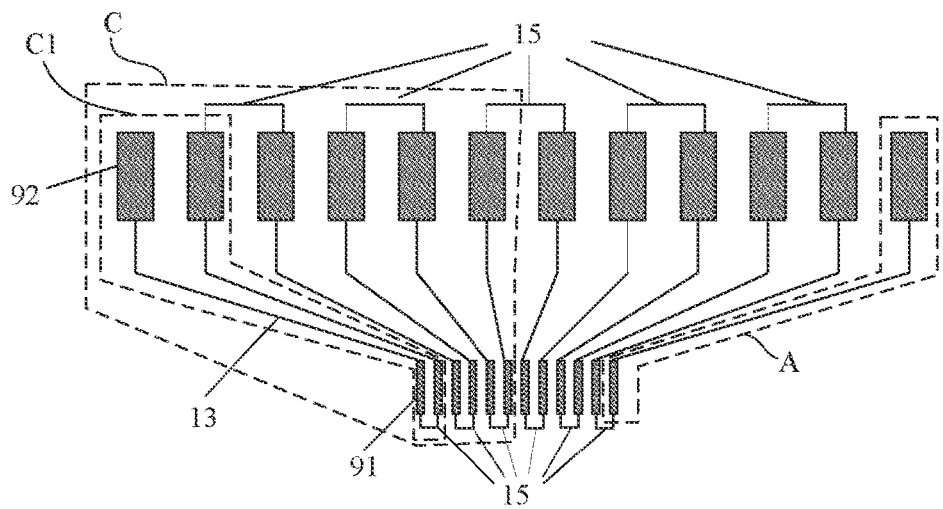
FIG. 8 is a schematic diagram of a detection unit and detection sub-units of a display substrate according to the embodiments of the present application.

In some embodiments, as shown in FIG. 8, each detection unit C includes a plurality of detection sub-units C1; each detection sub-unit C1 includes M connection structures connected in series, M being an integer greater than or equal to 1. The step S2 of measuring the head and the end of the detection unit C to obtain the resistance of the detection unit C, and determining whether there is a broken fanout wire 13 in the detection unit C includes: S21, measuring the head and the end of each detection unit C to obtain the resistance of the detection unit C, determining whether there is a broken fanout wire 13 in the detection unit C according to a first preset condition and the obtained resistance of the detection unit C, and performing step S22 if it is determined that there is a detection unit C having a broken fanout wire 13; and S22, measuring the head and the end of each detection sub-unit C1 of the detection unit C having a broken fanout wire 13 to find the broken fanout wire 13.

An example is given below to illustrate the steps S21 and S22. A total of 480 connection structures are disposed on the second surface of the base substrate 10; every adjacent 24 connection structures are set as one detection unit C, that is, the display substrate includes 20 detection units C; and then every six connection structures in each detection unit C are set as one detection sub-unit C1, that is, each detection unit C includes four detection sub-units C1. The second pads 92 of the first and last connection structures in each detection unit C are used as the detection points in a first detection process; and the second pads 92 of the first and last connection structures in each detection sub-unit C1 are used as the detection points in a second detection process.

In the first detection process, the second pads 92 of the first and last connection structures in each detection unit C are measured to obtain a resistance value of the detection unit C, whether there is a broken fanout wire 13 in the detection unit C is determined according to the resistance value, and the second detection process is performed if it is determined that there is a detection unit C having a broken fanout wire 13.

In the second detection process, the second pads 92 of the first and last connection structures in each detection sub-unit C1 of the detection unit C having a broken fanout wire 13 are measured to obtain a resistance value of the detection sub-unit C1, and the area where the broken fanout wire 13 is located may be narrowed according to the resistance value.

It should be noted that the broken fanout wire 13 may be repaired to connect the broken parts thereof together after it is detected. However, if the broken parts are seriously damaged, the display substrate is scrapped.

In some embodiments, if it is determined that there is no broken fanout wire 13 in the step S2 or the broken fanout wire 13 has been repaired, the method for detecting a broken fanout wire further includes step S3: cutting away the connecting part 15, which is located on a side of the second pad 92 away from the first pad 91, from the display substrate; and cutting off the connecting part 15 located on a side of the first pad 91 away from the second pad 92, so as to make the connection structures independent of each other.

Figure 9:
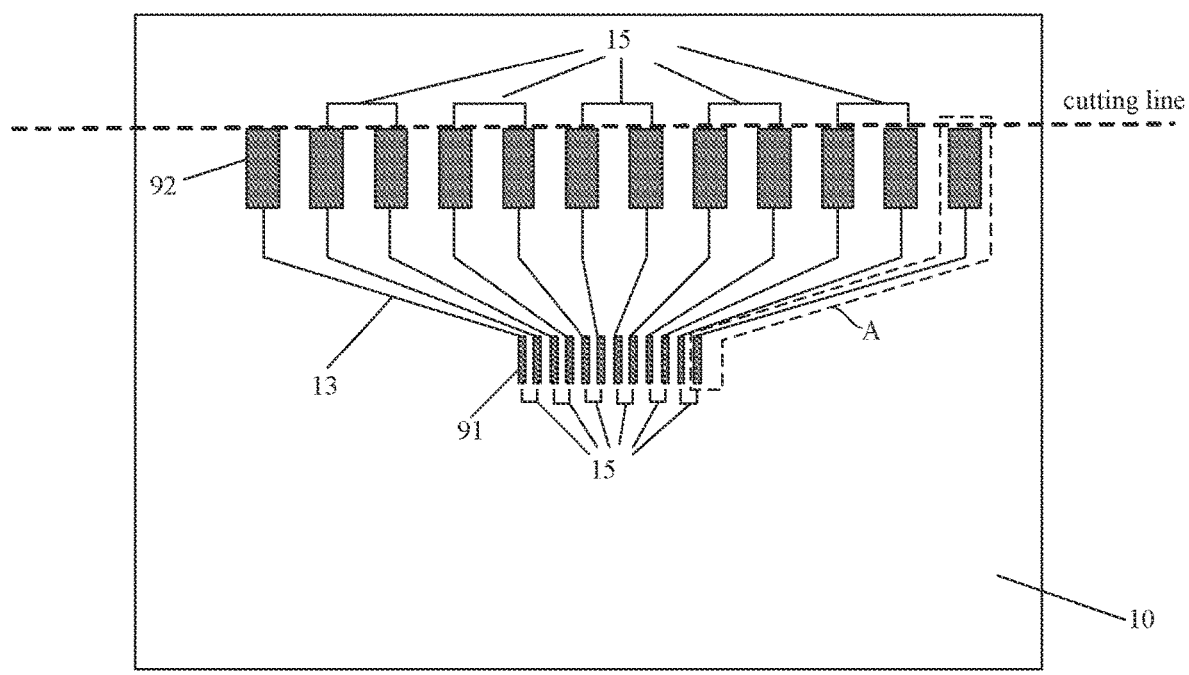
FIG. 9 is a schematic diagram illustrating cutting away connecting parts of a display substrate according to the embodiments of the present application.

Specifically, as shown in FIG. 9, each display substrate is obtained by cutting a display motherboard; in order to obtain a borderless display substrate, a series of electrical tests need to be carried out before the third pad on the second surface of the base substrate 10 is connected to the second pad 92 on the first surface of the base substrate 10 through the side wire, therefore, the edge of the display substrate needs to be recut to ensure that the second pad 92 is located at the outermost edge of the display substrate. The step S3 of cutting away the connecting part 15 located on the side of the second pad 92 away from the first pad 91 in the embodiments of the present application may be carried out by performing the recutting process.

In some embodiments, the connecting part 15 located on the side of the first pad 91 away from the second pad 92 may be cut off by means of laser cutting.

In the second aspect, the embodiments of the present application provide a display substrate, including: a base substrate 10 having a first surface and a second surface that are opposite to each other, and at least one detection unit C disposed on the base substrate 10. Each detection unit C includes at least two connection structures that are connected in series through a connecting part 15, and each connection structure includes a first pad 91, a second pad 92, and a fanout wire 13 that electrically connects the first pad 91 to the second pad 92.

The display substrate provided by the embodiments of the present application can be detected with the above method for detecting a broken fanout wire 13, and the details of the method will not be repeated here.

A plurality of third pads and pixel units are disposed at intervals on the second surface of the base substrate 10; the third pads are connected to the second pads 92 through side wires; and the third pads are connected to the pixel units through signal lead-in lines.

In some embodiments, the first pads 91 of every two adjacent connection structures are connected through a connecting part 15; except for the two connection structures which are farthest away from each other, the second pads 92 of every two adjacent connection structures are connected through a connecting part 15, and every N connection structures connected in series are taken as one detection unit C, N being an integer greater than or equal to 2.

That is, the first pads 91 and the second pads 92 may be connected through the connecting parts to form the S-type structure as shown in FIG. 6, with the second pads 92 of the first connection structure and the last connection structure serving as the head and are connected end of the S-type structure, respectively. Then, every N connection structures connected in series are taken as one detection unit C. The connection structures are divided into several detection units C, so that it is convenient to position an area where a broken fanout wire 13 is located in the subsequent detection process.

In some embodiments, except for the two connection structures which are farthest away from each other, the first pads 91 of every two adjacent connection structures are connected through a connecting part 15; the second pads 92 of every two adjacent connection structures are connected through a connecting part 15; and every N connection structures connected in series are taken as one detection unit C, N being an integer greater than or equal to 2.

In this way, the first pads 91 and the second pads 92 may be connected through the connecting parts to form the S-type structure as shown in FIG. 7, with the first pads 91 of the first connection structure and the last connection structure serving as the head and the end of the S-type structure respectively. Then, every N serially connected connection structures are taken as one detection unit C. The connection structures are divided into several detection units C, so that it is convenient to position an area where a broken fanout wire 13 is located in the subsequent detection process.

The other structures of the display substrate are the same as the above structures, and thus will not be repeated here.

Figure 10:
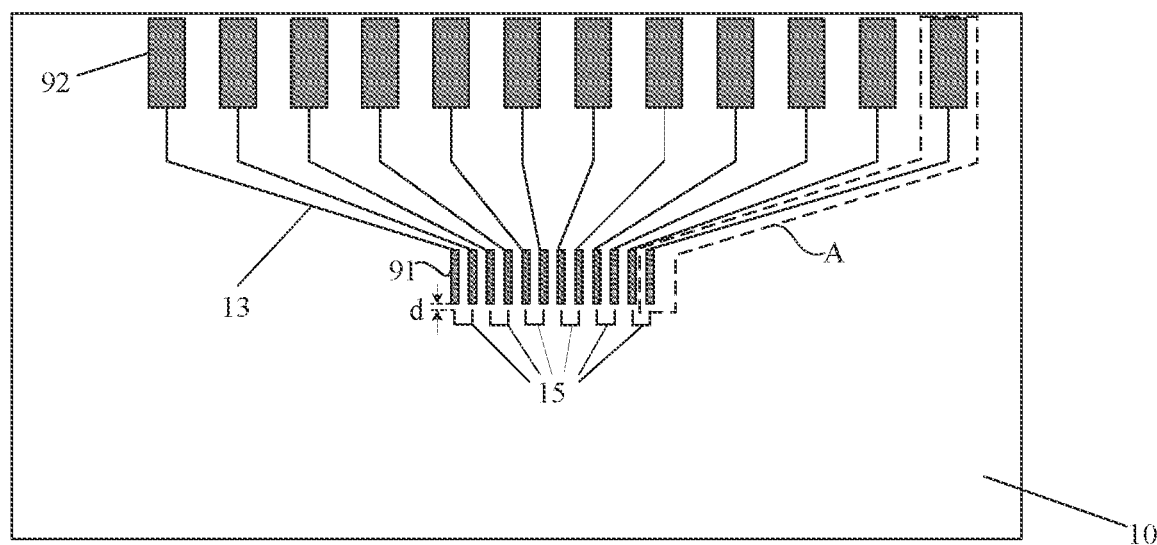
FIG. 10 is a schematic diagram of a display substrate according to the embodiments of the present application.

In the third aspect, as shown in FIG. 10, the embodiments of the present application Preliminary Amendment provide a display substrate, which is obtained by cutting away the connecting part 15 located on a side of the second pad 92 away from the first pad 91, and cutting off the connecting part 15 located on a side of the first pad 91 away from the second pad 92 after the above display substrate has been subjected to the above method for detecting a broken fan wire 13. The display substrate includes a base substrate 10 having a first surface and a second surface that are opposite to each other, and a plurality of connection structures and a plurality of connecting parts 15, which are disposed on the base substrate 10. Each connection structure includes a first pad 91, a second pad 92, and a fanout wire 13 that electrically connects the first pad 91 to the second pad 92; and each connecting part 15 corresponds to the first pads 91 of two connection structures, different connecting parts 15 correspond to different first pads 19, and the connecting parts 15 located on a side of the first pads 91 away from the second pads 92 are separated from the first pads 91. That is, there is a distance d between the connecting parts 15 and the first pads 91, and the distance d depends on laser precision, and is generally in a range from about 2 μm to 5 μm.

A plurality of third pads 93 and pixel units are disposed at intervals on the second surface of the base substrate 10; the third pads are connected to the second pads 92 through side wires; and the third pads 93 are connected to the pixel units through signal lead-in lines 5.

The other structures of the base substrate 10 of the display substrate are the same as the above structures, and thus will not be repeated here.

It should be understood that the above embodiments are merely exemplary embodiments adopted to illustrate the principles of the present application, and the present application is not limited thereto. Without departing from the spirit and essence of the present application, those skilled in the art may make various modifications and improvements to the present application, and should be considered to fall within the scope of the present application.

What is claimed is:

1. A method for detecting a broken fanout wire of a display substrate, wherein the display substrate comprises: a base substrate having a first surface and a second surface that am opposite to each other, and a plurality of connection structures arranged at intervals on the first surface, and each connection structure comprises a first pad, a second pad and a fanout wire that electrically connects the first pad to the second pad; and the method for detecting a broken fanout wire comprises:
   forming at least one detection unit, the forming of the detection unit comprising connecting at least two connection structures in series through a connecting part; and
   measuring a head and an end of the detection unit to obtain resistance of the detection unit, and determining whether there is a broken fanout wire in the detection unit,
   wherein each detection unit comprises a plurality of detection sub-units; each detection sub-unit comprises M connection structures connected in series, M being an integer greater than or equal to 1, and the step of measuring the head and the end of the detection unit to obtain the resistance of the detection unit, and determining whether there is a broken fanout wire in the detection unit comprises:
   measuring the head and the end of each detection unit to obtain the resistance of the detection unit, and determining whether there is a broken fanout wire in the detection unit according to a first preset condition and the obtained resistance of the detection unit, and
   in a case there is a broken fanout wire in the detection unit, measuring the head and the end of each detection sub-unit or the detection unit having a broken fanout wire to find the broken fanout wire.

2. The method of claim 1, wherein the step of forming at least one detection unit comprises:
   connecting the first pads of every two adjacent connection structures through a connecting part; except for the two connection structures which are farthest away from each other, connecting the second pads of every two adjacent connection structures through a connecting part, and taking every N connection structures connected in series as one detection unit, N being an integer greater than or equal to 2.

3. The method of claim 2, wherein N is an even number.

4. The method of claim 1, wherein the step of forming at least one detection unit comprises:
   except for the two connection structures which are farthest away from each other, connecting the first pads of every two adjacent connection structures through a connecting part; and connecting the second pads of every two adjacent connection structures through a connecting part, and taking every N connection structures connected in series as one detection unit, N being an integer greater than or equal to 2.

5. The method of claim 1, wherein both the head and the end of the detection sub-unit are the second pads.

6. The method of claim 1, after the step of measuring the head and the end of the detection unit to obtain the resistance of the detection unit, and determining whether there is a broken fanout wire in the detection unit, further comprising:
   cutting away the connecting part, which is on a side of the second pad away from the first pad, from the display substrate; and cutting off the connecting part on a side of the first pad away from the second pad.

7. A display substrate, comprising:
   a base substrate having a first surface and a second surface that are opposite to each other; and
   at least one detection unit on the base substrate and comprising at least two connection structures that are connected in series through a connecting part, each connection structure comprising a first pad, a second pad, and a fanout wire that electrically connects the first pad to the second pad,
   wherein the connection structures satisfy one of:
   (i) wherein the first pads of every two adjacent connection structures are connected through a connecting part except for the two connection structures which are farthest away from each other, the second pads of every two adjacent connection structures are connected through a connecting part, wherein every N connection structures connected in series are taken as one detection unit, and N is an integer greater than or equal to 2, and
   (ii) except for the two connection structures which are farthest away font each other, the first pads of every two adjacent connection structure are connected through a connecting part; the second pads of every two adjacent connection structures are connected through a connecting part, wherein every N connection structures connected in series are taken as one detection unit C, and N is an integer greater than or equal to 2.

8. The display substrate of claim 7, wherein a plurality of third pads and pixel units are arranged at intervals on the second surface;
   the second pads are connected to the third pads through side wires; and
   the third pads are connected to the pixel units through signal lead-in lines.

9. A display substrate, comprising:
   a base substrate having a first surface and a second surface that are opposite to each other; and
   a plurality of connection structures and a plurality of connecting parts on the base substrate, each connection structure comprising a first pad, a second pad, and a fanout wire that electrically connects the first pad to the second pad; wherein each connecting part corresponds to the first pads of two connection structures, and different connecting parts correspond to different first pads, and the connecting parts are separated from the first pads,
   wherein at plurality of third pads and pixel units are arranged at intervals on the second surface;
   the second pads are connected to the third pads through side wires; and
   the third pads are connected to the pixel units through signal lead-in lines.

\* \* \* \* \*